United States Patent [19]

Glance

[11] 4,041,416
[45] Aug. 9, 1977

[54] METHOD AND APPARATUS FOR FREQUENCY STABILIZING OSCILLATORS

[75] Inventor: Bernard Glance, Colts Neck, N.J.

[73] Assignee: Bell Telephone Laboratories, Incorporated, Murray Hill, N.J.

[21] Appl. No.: 734,718

[22] Filed: Oct. 22, 1976

[51] Int. Cl.² .............................................. H03B 3/06
[52] U.S. Cl. ....................................... 331/96; 331/9; 331/176; 333/83 T
[58] Field of Search ................. 331/1, 9, 96, 101, 102, 331/176; 333/83 T

[56] References Cited

U.S. PATENT DOCUMENTS

| 2,479,697 | 8/1949 | Norton | 331/176 |
| 3,617,924 | 11/1971 | Fujita et al. | 331/70 |
| 3,623,146 | 11/1971 | Kaneko | 331/96 |
| 3,949,328 | 4/1976 | Levaillant | 333/81 |
| Re. 23,598 | 12/1952 | Bradley | 331/175 |

OTHER PUBLICATIONS

Jn. of Sci. Instr., Oct. 1960, pp. 372-374 (vol. 37).
Jn. of Sci. Instr., Oct. 1960, pp. 398-399 (vol. 37).
Proc. of IEEE, vol. 61, No. 1, Jan. 1973, pp. 123-124.

Primary Examiner—John Kominski
Attorney, Agent, or Firm—E. W. Pfeifle

[57] ABSTRACT

Frequency stabilization of an oscillator by compensating for slow frequency variations due to ambient temperature variations is achieved by diverting a fraction of the oscillator output to a waveguide line section having a coefficient of thermal expansion/° C which is greater than the coefficient of relative frequency drift/° C of the oscillator comprising, in sequence, a variable attenuator and a movable short. The variable attenuator is used to primarily adjust the amplitude of the diverted signal by one-half the desired amount preferably without varying the phase of the diverted signal. The movable short is primarily used for signal phase adjustment while simultaneously reflecting the attenuated signal back through the attenuator and towards the oscillator output. Temperature variations which cause impedance changes in the oscillator, and in turn frequency changes at the output thereof, similarly affect the components of the divergent waveguide line section to produce reactive load variations therein of corresponding magnitude and opposite sign to the impedance changes in the oscillator.

6 Claims, 1 Drawing Figure

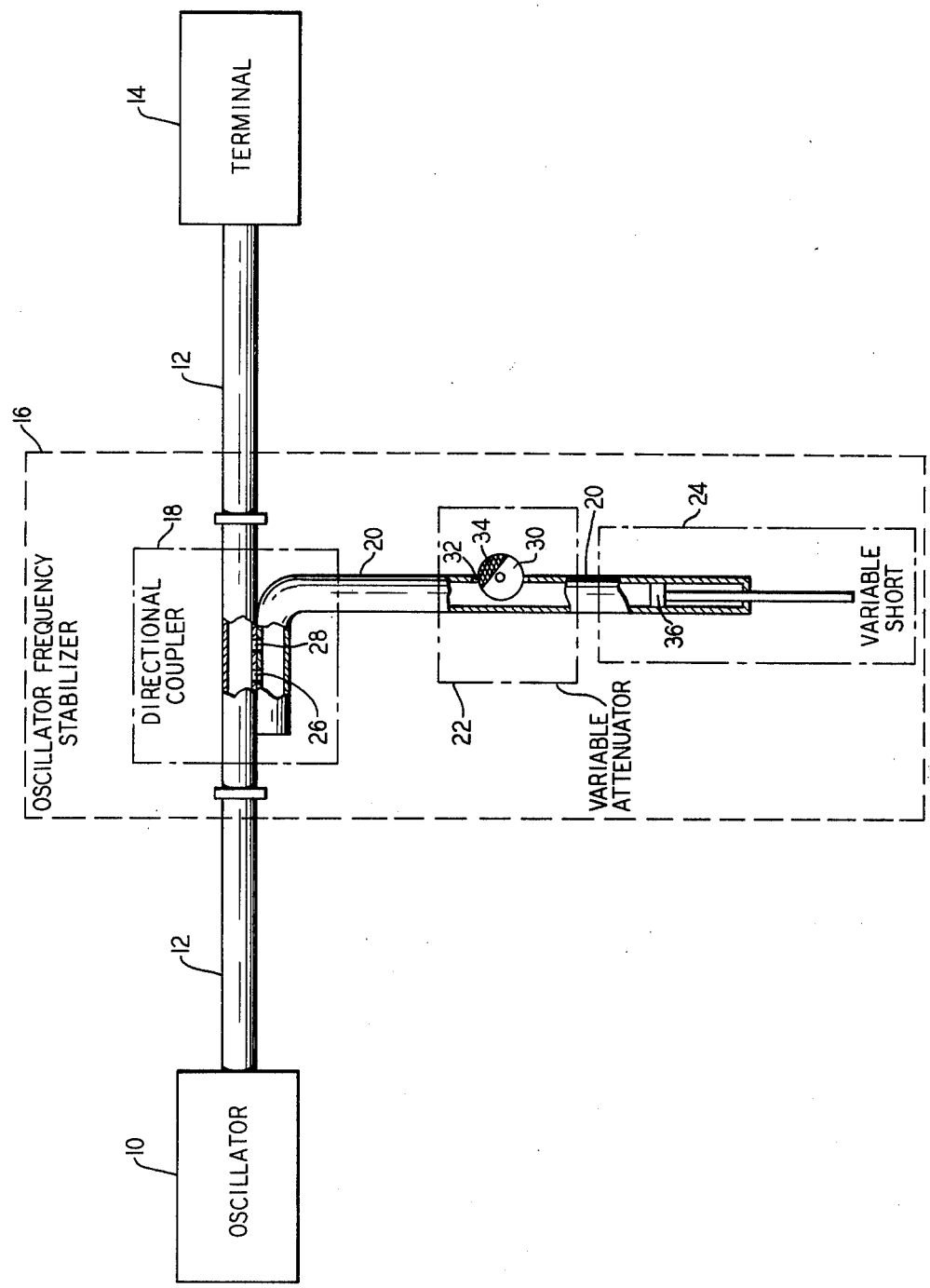

METHOD AND APPARATUS FOR FREQUENCY STABILIZING OSCILLATORS

BACKGROUND OF THE INVENTION

1. Field of the Invention

The present invention relates to method and apparatus for stabilizing the output frequency of an oscillator and, more particularly, to the frequency stabilization of an oscillator to compensate for slow frequency variations due to ambient temperature variations by diverting a fraction of the oscillator output to a line section having a coefficient of thermal expansion per degree Centigrade (/° C) which is greater than the coefficient of relative frequency drift/° C of the oscillator.

2. Description of the Prior Art

The stabilization of the output frequency of an oscillator has always been of importance and especially under conditions where the oscillator must operate unattended for long intervals of time during which, for example, ambient temperature fluctuations may occur as found, for instance, in communication systems.

U.S. Pat. No. 2,479,697 issued to L. E. Norton on Aug. 23, 1949 relates to a frequency stabilizer for wave generators wherein an impedance represented by a complex number is selected, transformed to a new impedance with a higher Q and lower absolute value, and then parallel resonated with another reactance having an opposite sign. This "synthetic" control resonator is used to stabilize the frequency of the generator. Circuit configurations are also disclosed which provide rapid rates of change of phase angle with changes in frequency.

U.S. Pat. No. Re. 23,598, reissued from U.S. Pat. No. 2,485,031 and issued to W. E. Bradley on Dec. 23, 1952, relates to a system for adjusting and stabilizing the frequency of high frequency oscillators as the voltage, current or load impedance varies. There, a parallel reactance, resonant to the frequency to be controlled, is connected across the transmission line. The reactance can be formed using a combination of network elements, coaxial lines, waveguides or resonant cavities which presents a capacitance to the line when the frequency rises in order to lower the frequency to normal and presents an inductance to the line when the frequency drops in order to raise the frequency to normal.

U.S. Pat. No. 3,617,924 issued to H. Fujita et al on Nov. 2, 1971 relates to an automatic frequency tuning system comprising an oscillator including a reference cavity, a load driven at the frequency provided from the oscillator, and a cooling line for supplying a fluid coolant from a common cooling source to both the reference cavity and the load, whereby the oscillation frequency is controlled in accordance with the temperature of the load and/or the reference cavity.

An article entitled "Transistorized Frequency Stabilization for Reflex Klystrons Used Magnetic Resonance" by P. Jung, Journal of Scientific Instruments, Vol. 37, Oct. 1960, pp. 372-374, discloses a frequency stabilizer configuration. There, the reflector voltage of the klystron is amplitude-modulated at a particular frequency. A cavity and a diode disposed at the end of the output waveguide, or in a branch thereof, acts as a frequency discriminator to transform the FM modulation into an AM wave. The output from the diode contains a component of the particular frequency which is proportional to the difference between the klystron frequency and the resonant frequency of the cavity. This error signal is amplified, demodulated and fed back to the reflector of the klystron over a lead to stabilize the oscillator frequency.

In an article "Frequency Stabilization of Klystrons," by M. J. A. Smith in Journal of Scientific Instruments, Vol. 37, Oct. 1960, pp. 398-399, an arrangement is disclosed for frequency stabilizing a kystron. There a portion of the power from the main waveguide is diverted by a directional coupler into a waveguide branch. The diverted power is mixed with a particular frequency from a separate reference source. The mixed signal next encounters a cavity tuned to one of the resulting sideband signals which signal continues to a detector crystal. The signal from the detector crystal is compared with a reference frequency and any error signal resulting from such comparison is fed to the klystron reflector over a separate lead to achieve frequency stabilization.

An article "Attainment of a Low-Noise High-Power and Highly Stable Gunn Oscillator by Coupling to a Superconducting Cavity," by J. J. Jimenez et al, Proceedings of the IEEE, Vol. 61, No. 1, January 1973, pp. 123-124 relates to a frequency stabilization circuit for a Gunn oscillator. There a high-Q superconducting cavity, which is the microwave equivalent of a low-frequency quartz filter, is coupled to a Gunn oscillator through a 10 dB coupler and a pair of phase shifters to optimize coupling. The cavity is placed in a constant pressure vessel filled with gaseous helium at a particular pressure to stabilize the cavity. The Gunn oscillator is feedback stabilized by the energy reflected from the cavity, the stabilization factor being directly proportional to the cavity Q. In the Jimenez et al arrangement, the frequency of the Gunn oscillator is determined by the frequency of the cavity which is maintained as stable as possible and unaffected by varying ambient temperatures.

BRIEF SUMMARY OF THE INVENTION

The present invention relates to method and apparatus for stabilizing the output frequency of an oscillator and, more particularly, to the frequency stabilization of an oscillator to compensate for slow frequency variations due to ambient temperature variations by diverting a fraction of the oscillator output to a line section having a coefficient of thermal expansion/° C which is greater than the coefficient of relative frequency drift/° C of the oscillator.

It is a further aspect of the present invention to stabilize the output frequency of an oscillator by diverting a fraction of the oscillator output to a line section having a coefficient of thermal expansion/° C which is greater than the coefficient of relative frequency drift/° C of the oscillator where the line section comprises, in sequence, a variable attenuator and a variable short.

Other and further aspects of the present invention will become apparent during the course of the following description and by reference to the accompanying drawings.

BRIEF DESCRIPTION OF THE DRAWING

Referring now to the drawing, the FIGURE is a schematic illustration of the preferred embodiment of the present invention.

DETAILED DESCRIPTION

In the FIGURE, the device in accordance with the present invention comprises an oscillator 10 tuned to generate an output signal of a desired frequency on a transmission line 12 for transmission to a terminal device 14 such as, for example, an antenna or a modulating means, and an oscillator frequency stabilizing arrangement 16. The oscillator frequency stabilizing arrangement 16 is shown as comprising a directional coupler 18, disposed along transmission line 12 preferably adjacent the output from oscillator 10, for diverting a portion of the output signal from oscillator 10 to a divergent path 20 which includes, in sequence, a variable attenuator 22 and a variable short 24. To achieve frequency stabilization of oscillator 10, the divergent path 20 must be formed to have a coefficient of thermal expansion/° C which is greater than the coefficient of relative frequency drift/° C of the oscillator 10.

Transmission line 12 can comprise any suitable means such as, for example, a coaxial cable or a hollow waveguide. On the other hand, oscillator frequency stabilizer 16 is formed primarily from hollow waveguide sections and components. Therefore, when transmission line 12 comprises means other than a hollow waveguide, suitable means must be provided at each end of the straight through path in directional coupler 18 to permit transfer of a signal between each of the connected ends of the transmission line 12 and the directional coupler 18 interconnecting path.

Directional coupler 18 can comprise any suitable waveguide coupler such as, for example, the well-known directional coupler shown in partial cross section in the FIGURE. There a first rectangular waveguide section, forming a part of transmission line 12, and a second rectangular waveguide section, forming one end of divergent path 20, are mounted parallel to each other with similarly dimensioned sides thereof bonded together. A first and a second aperture 26 and 28 are aligned parallel to the longitudinal axis of the waveguide sections and spaced a quarter wavelength apart in the connecting walls of the waveguide sections. As is well known to those skilled in the art, such arrangement permits signals to propagate between the oscillator 10 and both the terminal device 14 and divergent path 20 in either direction but does not permit signals to propagate between terminal device 14 and divergent path 20 in either direction.

Variable attenuator 22 can comprise any suitable waveguide attenuator means which preferably does not change the phase of the signal being attenuated. A typical variable attenuator which may be used is the well-known vane type waveguide attenuator, an example of which is shown in the FIGURE. There a thin dielectric disc 30 is rotatably mounted in a slot 32 in the waveguide of divergent path 20, the slot 32 being disposed parallel to the longitudinal axis of divergent path 20 between directional coupler 18 and variable short 24. Dielectric disc 30 has formed on corresponding segments of the two exposed major surfaces thereof a coating of resistive material 34. In operation, disc 30 can be rotated to insert a greater or lesser area of resistive coating into the waveguide of divergent path 20 which, in turn, will cause the signal propagating thereby to be attenuated by a greater or lesser amount, respectively.

Variable short 24 can comprise any suitable waveguide shorting means for reflecting the signal propagating in divergent path 20 and impinging thereon. A preferred arrangement is the well-known variable shorting means shown in partial cross section in the FIGURE. There, a piston 36 is located symmetrically along the longitudinal axis of a length of precision rectangular waveguide. The piston 36 can be made to move parallel to the longitudinal axis of the waveguide by a precision screw or a micrometer (not shown) in order to adjust the phase of the reflected signal.

In operation, a portion of the signal generated by oscillator 10, and propagating down transmission line 12, is diverted into a divergent path 20 by directional coupler 18. The diverted signal first encounters variable attenuator 22 which is initially adjusted to attenuate the amplitude of the diverted signal by one-half of the desired amount preferably without varying the phase of the diverted signal. The diverted and attenuated signal then encounters movable short 24 which provides signal phase adjustment while simultaneously reflecting the signal back through variable attenuator 22, where the diverted, attenuated and reflected signal has its amplitude attenuated by the remaining one-half of the desired amount. The reflected and doubly attenuated signal is transmitted back to oscillator 10 via directional coupler 18. The components of divergent path 20 produce reactive load variations in response to ambient temperature variations which counteract impedance changes in the oscillator due to the ambient temperature variations to maintain a stable oscillator output frequency.

Frequency stabilization of oscillator 10 is achieved by initially adjusting the oscillator 10, variable attenuator 22 and variable short 24, after these components have reached a steady state operating condition at the then ambient temperature (the reference temperature), to generate the desired frequency at the oscillator output. Thereafter, temperature variations which cause impedance changes in oscillator 10 and, in turn, cause frequency deviations in the output thereof, similarly affect the components of divergent path 20 to produce reactive load variations therein of corresponding magnitude and of opposite sign to the impedance changes in the oscillator 10 to thereby maintain the frequency of the oscillator output signal stable.

The operation and parameters of the present oscillator frequency stabilizing arrangement can also be shown in the following manner.

The frequency of an oscillator loaded by the circuit in the FIGURE is given by $$Q(\omega_0 - \omega) - \omega \rho \frac{\sin \frac{2\omega l}{v}}{1 + \rho^2 + 2\rho \cos \frac{2\omega l}{v}} = 0 \qquad (1)$$

where $\omega_o$ is the desired oscillator frequency, $\omega$ is the oscillator free running frequency which varies with ambient temperature changes, $\rho$ is the reflection coefficient, $l$ is the line length between the movable short 24 and the oscillator 10, $v$ is the phase velocity along the line and Q is the Q factor of oscillator 10. When the temperature T varies, Equation (1) can be written as $$F(T,\omega) = 0. \qquad (2)$$

The frequency drift parameter, near the reference ambient temperature $T_o$ which gives $\omega_o$, is derived from $$\left( \frac{\delta \omega}{\delta T} \right)_{T=T_0} = \frac{-\frac{\delta F}{\delta T}}{\frac{\delta F}{\delta \omega}} . \qquad (3)$$

This frequency drift parameter is assumed to be a linear function of T near $T_o$, and it can be positive or negative depending on whether the oscillator frequency increases or decreases with increasing temperature, and thus can be expressed as $$\frac{\delta \omega_0}{\delta T} = \pm \alpha_2 \omega_0 \tag{4}$$

where $\alpha_2$ is the coefficient of relative frequency drift/° C of the oscillator.

When $\alpha_2$ is negative, the short is moved until one obtains $$\omega = \omega_o \tag{5}$$

and $$\frac{2\omega_0 l}{v_g} = (2p + 1)\pi \quad (p = 1, 2, 3 \ldots). \tag{6}$$

From Equations (5) and (6), the frequency drift parameter can be expressed as $$\frac{\delta \omega}{\delta T} = \omega_0 \left\{ \frac{\frac{2\rho}{(1-\rho)^2} \frac{1}{Q} \frac{\omega_0 l}{v_g} \alpha_1 - |\alpha_2|}{1 - \frac{2\rho}{(1-\rho)^2} \frac{1}{Q} \frac{\omega_0 l}{v_g}} \right\} \tag{7}$$

where $\alpha_1$ is the coefficient of linear expansion of the transmission line and $v_g$ is the group velocity along the line and $\delta\omega_o/\delta T$ is the frequency drift of the oscillator. To avoid frequency discontinuities, the coefficient $\alpha_1$ must satisfy:

$$\frac{2\rho}{(1-\rho)^2} \frac{1}{Q} \frac{\omega_0 l}{v_g} < 1. \tag{8}$$

A zero frequency drift can be obtained when $$\frac{2\rho}{(1-\rho)^2} \frac{1}{Q} \frac{\omega_0 l}{v_g} \alpha_1 = |\alpha_2|, \tag{9}$$

which requires that the coefficient of linear expansion of the transmission line be larger than the relative frequency drift of the oscillator, thus $$\alpha_1 > \left| \frac{1}{\omega_0} \frac{\delta \omega_0}{\delta T} \right|. \tag{10}$$

When $\alpha_2$ is positive, the short is moved to obtain $$\omega = \omega_o \tag{11}$$

and $$\frac{2\omega_0 l}{v_g} = 2p\pi \quad (p = 1, 2, 3 \ldots). \tag{12}$$

The two sets of positions given by Equations (6) and (12) can be discriminated, when the short is moved, by the slope $\delta\omega/\delta l$ of the pulling effect. In the case $\alpha_2$ is positive, the derivation of Equation (3) can be found to yield $$\left( \frac{\delta \omega}{\delta T} \right)_{T=T_0} = \omega_0 \left\{ \frac{|\alpha_2| - \alpha_1 \frac{2\rho}{(1+\rho)^2} \frac{1}{Q} \frac{\omega_0 l}{v_g}}{1 + \frac{2\rho}{(1+\rho)^2} \frac{1}{Q} \frac{\omega_0 l}{v_g}} \right\}, \tag{13}$$

and stabilization is obtained if $$\alpha_1 \left( \frac{1-\rho}{1+\rho} \right)^2 > |\alpha_2|. \tag{14}$$

To illustrate the above discussion in a practical example, consider a 60 GHz oscillator with an external loaded Q of 100 having a linear frequency drift:

$$\frac{1}{2\pi} \left( \frac{\delta \omega}{\delta T} \right)_{T=T_0} = -1 \text{ MHz/° C} \tag{15}$$

$$\alpha_2 = \frac{1}{\omega_0} \frac{\delta \omega_0}{\delta T}$$

$$= -1.67 \times 10^{-5}/° \text{ C}.$$

The oscillator is connected to a directional coupler 18 in series with a variable attenuator 22 made in aluminum waveguide 20 centimeters long, having a coefficient of linear expansion $$\alpha_1 = 2.5 \times 10^{-5}/° \text{ C}, \tag{16}$$

fulfilling the condition
$\alpha_1 > |\alpha_2|$.

The variable attenuator 22 must be adjusted so that the return loss equals $-21.48$ dB giving $\rho = 0.084$ which satisfies the condition of Equation (8).

The oscillator output frequency stabilization arrangement of the present invention is well suited to millimeter-wave oscillators having a low Q such as IMPATT or Gunn Oscillators. It can be readily implemented in an oscillator circuit and takes little RF power. Stabilization is obtained by adjusting a variable attenuator when the frequency drift parameter $d\omega/dT$, is known. The arrangement cannot, however, provide stabilization for the frequency drift which occurs immediately after the oscillator is turned on, and it becomes operational only after the oscillator has reached its steady state condition. Frequency control for this transient period can be obtained by a current control built into the power supply.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of stabilizing the frequency of an oscillator comprising the steps of:
   a. tapping a fraction of the output signal from the oscillator propagating in a main transmission line into a second waveguide transmission line section having a coefficient of thermal expansion per degree Centigrade (/° C) which is greater than the coefficient of relative frequency drift/° C of the oscillator, said oscillator output signal including frequency deviations due to the effect of ambient temperature variations on the oscillator;

b. attenuating the tapped signal propagating in said second waveguide transmission line section by a predetermined amount;

c. reflecting the attenuated signal back along said second waveguide transmission line section towards said oscillator, said second waveguide transmission line section elements functioning in response to ambient temperature variations to produce reactive load variations having a corresponding magnitude and an opposite sign to impedance changes in the oscillator caused by said ambient temperature variations which, in turn, produce said frequency deviations therein.

2. Apparatus for stabilizing the frequency of an oscillator according to claim 1 wherein said attenuator comprises a vane which is capable of being precisely inserted through a slot in said second waveguide transmission line section to adjust the amplitude of the signal propagating in said second waveguide transmission line section by a predetermined amount.

3. Apparatus for stabilizing the frequency of an oscillator, comprising:

a main transmission line connected to the output from the oscillator;

a second waveguide transmission line section having a coefficient of thermal expansion/° C which is greater than the coefficient of relative frequency drift/° C of the oscillator;

means disposed along said main transmission line capable of diverting a fraction of an output signal from the oscillator to said second waveguide transmission line section;

means disposed along said second waveguide transmission line section for reflecting the diverted signal back along said second transmission line section towards said diverting means and oscillator; and an attenuator disposed along said second transmission line section between said diverting means and said reflecting means for attenuating the diverted signal propagating in a first direction therethrough and the reflected signal propagating in a second direction therethrough by a predetermined amount, said second transmission line section including said reflecting means and attenuator being affected by ambient temperature variations to produce reactive load variations having a corresponding magnitude and an opposite sign to impedance changes in the oscillator caused by said ambient temperature variations which in turn causes said frequency deviations therein.

4. Apparatus for stabilizing the frequency of an oscillator according to claim 2 wherein said reflecting means is a piston slidably disposed along the longitudinal axis of said second waveguide transmission line section to permit the adjustment of the phase of the signal being reflected back along said second transmission line section.

* * * * *